(12) United States Patent
Palmer

(10) Patent No.: US 10,930,354 B2
(45) Date of Patent: Feb. 23, 2021

(54) ENHANCED FLUSH TRANSFER EFFICIENCY VIA FLUSH PREDICTION

(71) Applicant: Micron Technology, Inc., Boise, ID (US)

(72) Inventor: David Aaron Palmer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/799,490

(22) Filed: Feb. 24, 2020

(65) Prior Publication Data

US 2020/0194082 A1 Jun. 18, 2020

Related U.S. Application Data

(63) Continuation of application No. 16/208,165, filed on Dec. 3, 2018, now Pat. No. 10,573,391.

(51) Int. Cl.
*G06F 12/08* (2016.01)
*G11C 16/16* (2006.01)
*G11C 16/08* (2006.01)
*G06F 3/06* (2006.01)
*G11C 7/10* (2006.01)

(52) U.S. Cl.
CPC .......... *G11C 16/16* (2013.01); *G06F 3/0688* (2013.01); *G11C 7/109* (2013.01); *G11C 7/1084* (2013.01); *G11C 16/08* (2013.01)

(58) Field of Classification Search
CPC ....... G11C 16/16; G11C 16/08; G11C 7/1084; G06F 3/0688
USPC .......................................................... 365/218
See application file for complete search history.

(56) References Cited

U.S. PATENT DOCUMENTS

| | | | |
|---|---|---|---|
| 8,200,904 B2 * | 6/2012 | Lasser | G06F 12/0884 711/135 |
| 9,658,966 B2 | 5/2017 | Vishne et al. | |
| 10,573,391 B1 | 2/2020 | Palmer | |
| 2016/0147671 A1 | 5/2016 | Vishne et al. | |

* cited by examiner

*Primary Examiner* — Xiaochun L Chen

(74) *Attorney, Agent, or Firm* — Schwegman Lundberg & Woessner, P.A.

(57) ABSTRACT

Devices and techniques for enhanced flush transfer efficiency via flush prediction in a storage device are described herein. User data from a user data write can be stored in a buffer. The size of the user data stored in the buffer can be smaller than a write width for a storage device subject to the write. This size difference results in buffer free space. A flush trigger can be predicted. Additional data can be marshaled in response to the prediction of the flush trigger. The size of the additional data is less than or equal to the buffer free space. The additional data can be stored in the buffer free space. The contents of the buffer can be written to the storage device in response to the flush trigger.

21 Claims, 5 Drawing Sheets

ENHANCED FLUSH TRANSFER EFFICIENCY VIA FLUSH PREDICTION

PRIORITY APPLICATION

This application is a continuation of U.S. application Ser. No. 16/208,165, filed Dec. 3, 2018, which is incorporated herein by reference in its entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), or magnetoresistive random-access memory (MRAM), among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) can extend adjacent a string of storage cells to form a channel for the storages cells of the string. In the example of a vertical string, the polysilicon structure can be in the form of a vertically extending pillar. In some examples the string can be "folded," and thus arranged relative to a U-shaped pillar. In other examples, multiple vertical structures can be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs can include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

Figure 1:
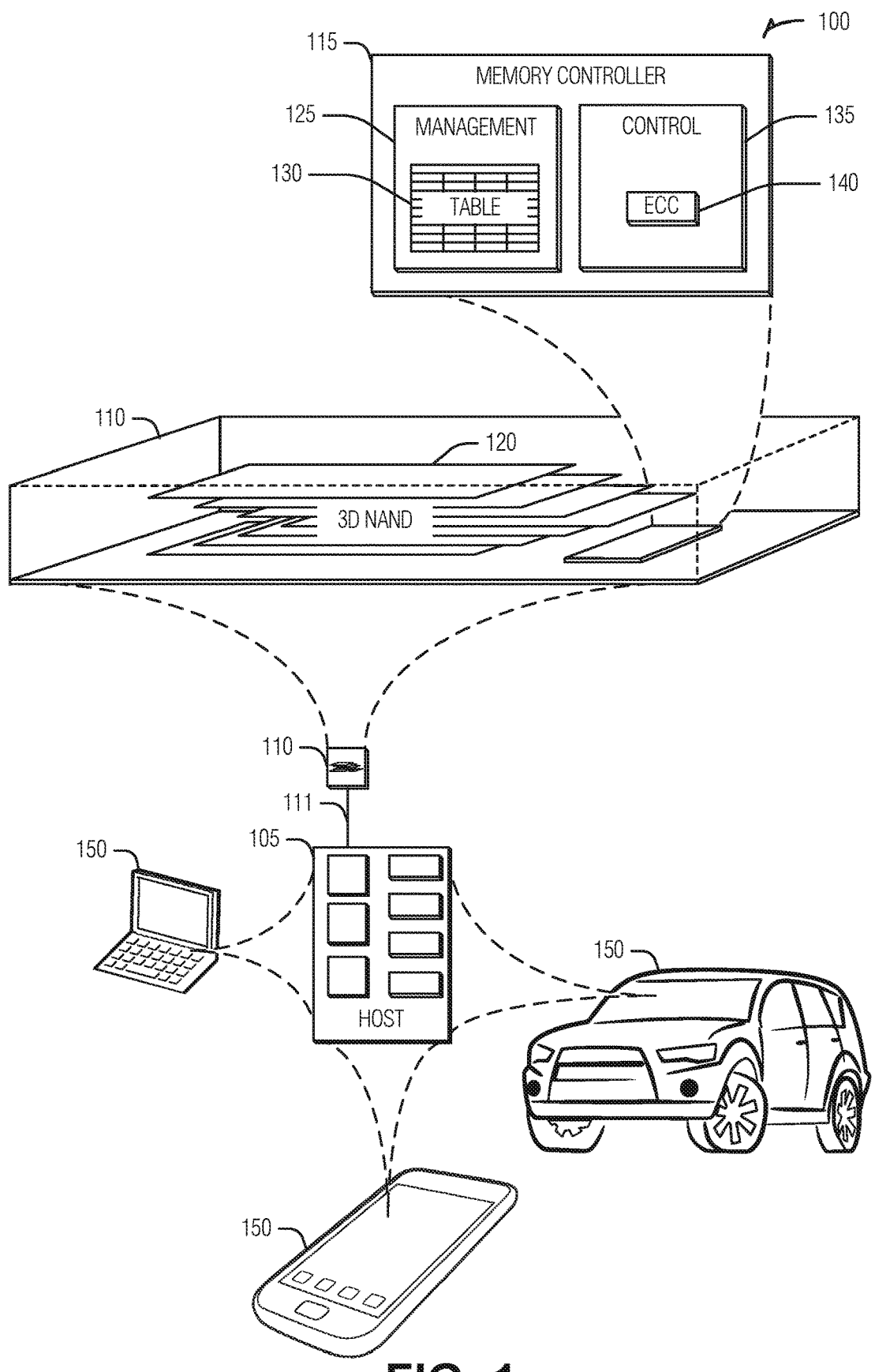
FIG. 1 illustrates an example of an environment including a memory device.

Data written to a non-volatile memory device, such as a flash device, is typically buffered (e.g., in a write buffer or write cache) before being written to the underlying storage array. The buffering typically enables faster write transfers to the memory device and also enables any special handling of the data, such as resolving logical-to-physical (L2P) relationships between storage units (e.g., virtual blocks to physical blocks).

Often, writing data to the storage array is accomplished in segments of a defined size. Example increments can include thirty-two bits, sixty-four bits, one-hundred twenty-eight bits, etc. The specific increments available for writing are generally defined by the underlying hardware. Thus, a thirty-two bit increment can correspond to thirty-two connectors from the buffer, or other device, to the array elements. The size of the increment is often a design decision by the array developer to balance granularity for speed or complexity. The size of the buffer can correspond to a multiple of the storage array write increment.

Generally, the data is flushed from the buffer to the array in response to a trigger. Example triggers include a full buffer, an aging factor, or another established condition or state, in response to which the buffer is to be flushed (examples of which are discussed further below in reference to FIG. 1). The aging factor defines a longest period data can reside in the buffer. The aging factor is an example of a trigger that causes the buffer to flush before the data is equal to a storage array write increment. As data is written to the array in whole write increments, the buffered data is generally padded with zeroes, or similar filler material, to equal the write increment before being written to the array.

When large pieces of data are written, such as a multi-megabyte media file, the padding procedure does not result in much inefficiency as only one write increment is generally padded amongst thousands. The smaller the write increment, the less inefficiency exists, although even relatively large write increments involve large ratios of real data (e.g., data that is intended to be written) to padding data.

However, when small pieces of real data are written, the ratio of real data to padding data drops and can lead to significant storage consumption by padding data. This scenario is becoming more common with the increasing advent of devices that wake for short periods, write small status updates to the storage device, and resume a low-power (e.g., sleep, hibernation, etc.) state. Such devices include mobile phones, tablets, Internet-of-Things (IoT) appliances, and sensors among others. When considering flash devices in the storage array, not only can significant storage be consumed by the padding data, but the writing of irrelevant padding data can lead to increased device wear, shortening the operating life of the storage array.

To address these problems, some or all of the padding data can be replaced with useful data. Generally, the memory device writes certain maintenance (e.g., management) data to the storage array. Such maintenance data can include L2P table portions, metadata, statistics (e.g., write error statistics for blocks), bad-block tables, etc. In some traditional arrangements, this maintenance data is written to sections of the storage array reserved for maintenance data, or otherwise segregated from user data. However, here, the maintenance data replaces the padding data, resulting in fewer writes to the storage array and more efficient use of the underlying storage.

The maintenance data is marshaled (e.g., collected, retrieved, assembled, etc.) to replace the padding data for the write in response to a prediction of a flush trigger. The flush trigger prediction attempts to determine a window preceding the flush trigger in which additional user data from the host will not be received. As this is a generally idle period for the memory device, using this time to marshal the additional data does not impact the user experience (e.g., should go unnoticed to the host). If the flush trigger prediction is incorrect—e.g., the host writes more user data before the flush trigger actually occurs—the additional data added to the buffer is replaced with the additional user data. If there is free space remaining in the buffer, the process of marshaling the additional data can begin again, filling the remaining free space with useful data rather than padding data.

The maintenance data can be accumulated in one or more separate buffers than the write buffer described above. It is from these separate buffers that the maintenance data to satisfy the padding size are marshaled. Direct component querying can also be used to marshal the maintenance data. In an example, the memory controller updates a lookup data structure to locate the maintenance data. This is useful because the maintenance data can become distributed throughout the storage array or intermingled with the user data.

Once the flush trigger actually occurs, the writing of the buffer contents (e.g., user data and additional data) can occur without any additional processing latencies to impact the write to the underlying storage. Additional details and examples are provided below.

FIG. 1 illustrates an example of an environment 100 including a host device 105 and a memory device 110 configured to communicate over a communication interface. The host device 105 or the memory device 110 can be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105. In these examples, the memory device 110 communicates with host device 105 components via an interlink 111, such as a bus. Thus, as described herein, a host, or host device 105 operation is distinct from those of the memory device 110, even when the memory device 110 is integrated into the host device 105.

One or more communication interfaces (e.g., the interlink 111) can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 can be a machine having some portion, or all, of the components discussed in reference to the machine 500 of FIG. 5.

The memory controller 115 can receive instructions from the host 105, and can communicate with the memory array 120, such as to transfer data to (e.g., write or erase) or from (e.g., read) one or more of the memory cells, planes, sub-blocks, blocks, or pages of the memory array 120. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. Although the memory controller 115 is here illustrated as part of the memory device 110 package, other configurations can be employed, such as the memory controller 115 being a component of the host 105 (e.g., as a discrete package on a system-on-a-chip of the host 105 that is separate from the memory service 110), or even implemented via a central processing unit (CPU) of the host 105.

The memory manager 125 can include, among other things, circuitry or firmware, such as several components or integrated circuits associated with various memory management functions. For purposes of the present description example memory operation and management functions will be described in the context of NAND memory. Persons skilled in the art will recognize that other forms of non-volatile memory can have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things. In an example, the management tables 103 can include translation tables or a logical-to-physical (L2P) mapping.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data based on the ECC data maintained by the array controller 135. This enables the memory controller 115 to maintain integrity of the data transferred between the host 105 and the memory device 110 or maintain integrity of stored data. Part of this integrity maintenance can include removing (e.g., retiring) failing memory resources (e.g., memory cells, memory arrays, pages, blocks, etc.) to prevent future errors. RAIN is another technique that can be employed by the memory device 110 to maintain data integrity. The array controller 135 can be arranged to implement RAIN parity data generation and storage in the array 120. The memory controller 115 can be involved in using the parity data to reconstruct damaged data.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, can be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB can include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or can require different amounts of metadata associated therewith. For example, different memory device types can have different bit error rates, which can lead to different amounts of metadata necessary to ensure integrity of the page of data (e.g., a memory device with a higher bit error rate can require more bytes of error correction code data than a memory device with a lower bit error rate). As an example, a multi-level cell (MLC) NAND flash device can have a higher bit error rate than a corresponding single-level cell (SLC) NAND flash device. As such, the MLC device can require more metadata bytes for error data than the corresponding SLC device.

Several of the preceding components can be arranged to implement efficient flush transfers via flush prediction, such as the memory controller 115 or the array controller 135. The following examples use the memory controller 115 as the implementing component, although any component of the host 105 or the memory device that includes the following arrangement of components is also implementing the efficient flush transfer described herein.

As noted above, the issue solved by the described efficient flush transfer address a discrepancy between the amount of user data buffered in the memory controller 115 from the host and the write width of the array 120. As used herein, the write width is a size of data that can be written to the array 120. As noted above, generally the smallest unit of data that can be written to a flash array is a page (e.g., between two and sixteen kilobytes). However, some designs can permit smaller write widths or greater write widths, such as a block, superblock, etc.

A typical design of the memory controller 115 includes a buffer that is equal to at least the smallest write width supported by the array 120. Thus, if the buffer is filled, it can be flushed in write-width increments enabling efficient use of the storage array 120. However, any other flush trigger, such as expiration of a timer period (e.g., a timeout, data aging, etc.), power-down interrupt for the memory device 110, or explicit flush request from the host 105, can result in buffered user data that is smaller, often significantly so, than the write width, resulting in a size discrepancy that was traditionally addressed by adding padding data (e.g., irrelevant or dummy data) to the user data until it equaled the write width. Efficient flush transfer of the user data replaces this padding data with useful data (e.g., data that would otherwise be written to the array 120) to reduce the inefficiency of writing padding data.

To this end, the memory controller 115 is arranged to predict a flush trigger for a user data write that has user data buffered in the memory controller 115. The flush trigger can include receipt of a command or interrupt from the host 105 to flush the write, of a maintenance operation—such as a power down signal for the memory device 110 or an extreme operating condition of the memory device—used to preserve data to the array 120, of expiration of a timer period—e.g., to prevent risk of data loss by leaving it in the volatile memory of the buffer too long, among others. In any case, the flush trigger involves a signal to write the user data from the buffer to the array 120 when the user data is smaller than the write width.

The prediction of the flush trigger is a determination that the flush trigger will be the next event with respect to the buffer that the memory controller 115 receives. Thus, the prediction establishes a window in which no additional user data is expected from the host 105. The prediction of the flush trigger would be incorrect, for example, if, after the flush trigger is predicted, the host 105 sends additional user data to the memory device 110.

A variety of techniques can be used to make the flush trigger prediction. For example, if the host 105 generally writes data less than the write width immediately upon waking, then the memory controller 115 can make the flush trigger prediction by noting the end of a first host 105 write following a wake signal. Similarly, if the host has a non-linear writing pattern, such that the further in time from a last write reduces the likelihood of a next write, the flush trigger prediction can be of a buffer timeout that passes a last-time-since-written threshold for the host 105. Similarly, a pattern of writes—e.g., every fifth write is flushed by command from the host 105 or every ten kilobytes is flushed from a command from the host 105—can be tracked by the memory controller 115 to make the flush prediction. Often these metrics can be maintained in a register, or other similarly small data element of the memory controller 115 that does not generally involve much overhead to maintain.

The memory controller 115 is arranged to marshal (e.g., collect, retrieved, query, or otherwise obtain) additional data in response to the flush trigger prediction. As noted above, the flush trigger prediction provides a predicted window of inactivity from the host 105 that enables the memory controller 115 to collect the additional data without impacting other operations, such as the time to complete the write to the array 120. This efficiency risks additional user data coming from the host 105 when the flush trigger prediction is wrong but is often worth the risk given the generally stable behavior patterns of the host 105 in a variety of scenarios.

When the flush trigger prediction is incorrect, the memory controller 115 is arranged to replace the additional data written to the buffer in response to the prediction with the new (e.g., additional) user data. Locating the additional data in the buffer to replace it can be facilitated by a tag maintained contemporaneously with the original writing of the additional data. In an example, the tag is an address in the buffer indicating the first word of the additional data. In an example, the tag precedes or follows the additional data—depending upon whether the additional data was appended or prepended to the original user data respectively. In this example, the memory controller 115 is arranged to scan the buffer to locate the additional data.

Once the new user is added to the old user data in the buffer, the memory controller 115 can re-evaluate the flush trigger prediction and the remaining free space in the buffer and begin the procedure of filling any remaining free space with additional data again. This additional processing enables a flexibility in this technique for error in the flush trigger prediction with little impact on memory device operations.

The additional data is marshaled to fill the free space of the buffer. However, in situations where the user data plus the units of additional data do not align precisely upon the write width (e.g., they are either a little larger or a little smaller than the word width), then units of the additional data that fits within the free space are used. Here, a unit of additional data refers to the discrete elements that give additional data meaning. For example, if the additional data is a count of bad-blocks, the unit of additional data is the entire count plus the metadata that normally accompanies a bad-block data structure. To be smaller would deprive the additional data of meaning and be equivalent to padding data. Padding data is used to fill-out the buffer free space if any remains after the additional data is considered.

In an example, the additional data is maintenance (e.g., management) data of the storage device. In an example, the maintenance data includes L2P data mappings. In this example, L2P mappings are often segmented to enabling smaller volatile memory buffers in the memory controller 115. When it is needed, the L2P mapping segment is loaded from the array 120 into the memory controller 115 and used to determine which physical address corresponds to a logical address provided by the host 105, for example. These mapping are frequently used and updated upon most writes and maintenance operations, such as garbage collection. Thus, an L2P mapping segment can be updated and re-written to the array 120 frequently, making it often available as additional data.

In an example, the maintenance data includes wear leveling data. In an example, the maintenance data includes cross-temperature data. In an example, the maintenance data includes power-down data. These forms of maintenance data can be accumulated in buffers of registers of the memory controller 115 and occasionally written for future use. They are often smaller than the L2P mappings described above and enable use of smaller buffer free spaces for additional data.

The memory controller 115 is arranged to write the user data and the additional data to the array 120 in response to the flush trigger (e.g., the actual flush trigger and not the prediction of the flush trigger). The result is a co-location of the user data and the additional data within a write width on the array 120. This arrangement varies from traditional systems that generally kept the memory device 110 data separate from the user data, either by designating certain areas of the array 120 to the memory device 110 data, or by keeping the write width (e.g., a page or a block) entirely user data or entirely memory device 110 data. To address this change in data organization, the memory controller 115 is arranged to mark the additional data to enable its future retrieval. In an example, the additional data is comingled with user data based on physical addresses. In an example, the additional data includes metadata signifying that it is not user data. Here, the user data and the additional data share the same physical address, thus the comingling. However, the metadata written with the additional data signifies what it is. Thus, to retrieve the additional data, the memory controller 115 loads the page, for example, specified by the physical address and scans the pages until it reaches the metadata tag, taking the remaining data of the page as the additional data. This technique does not rely on additional tracking techniques than that used in traditional maintenance data tracking but does consume some extra bits to write the metadata and can involve additional processing on the read.

In an example, the additional data is segregated from user data based on physical addresses. In an example, the additional data includes an address identifier upon which the segregation is enforced. In an example, the address identifier is in metadata of the additional data. In an example, the address identifier is one of an absolute address or an address relative to an address of the user data. In these examples, the user data and the additional data have addressed based distinctions. For example, in the relative to the user data address example, the additional data is specified by the user data and address and an offset. Thus, the memory controller 115 can simply read the page, for example, and skip offset bits to get to the additional data. In the case of an absolute address, the memory controller 115 can retrieve the additional data directly without reference to the user data address. This direct addressing can be supported via virtual address, or the like, that support write width resolution for reading. In all of these cases, the metadata of the additional data that supports the segregated addressing is generally stored elsewhere, such as in one of the tables 130 or otherwise managed by the memory manager 125. This technique can include additional overhead to that of traditional techniques but can result in more efficient use of the storage array 120 or increased read performance.

Figure 2:
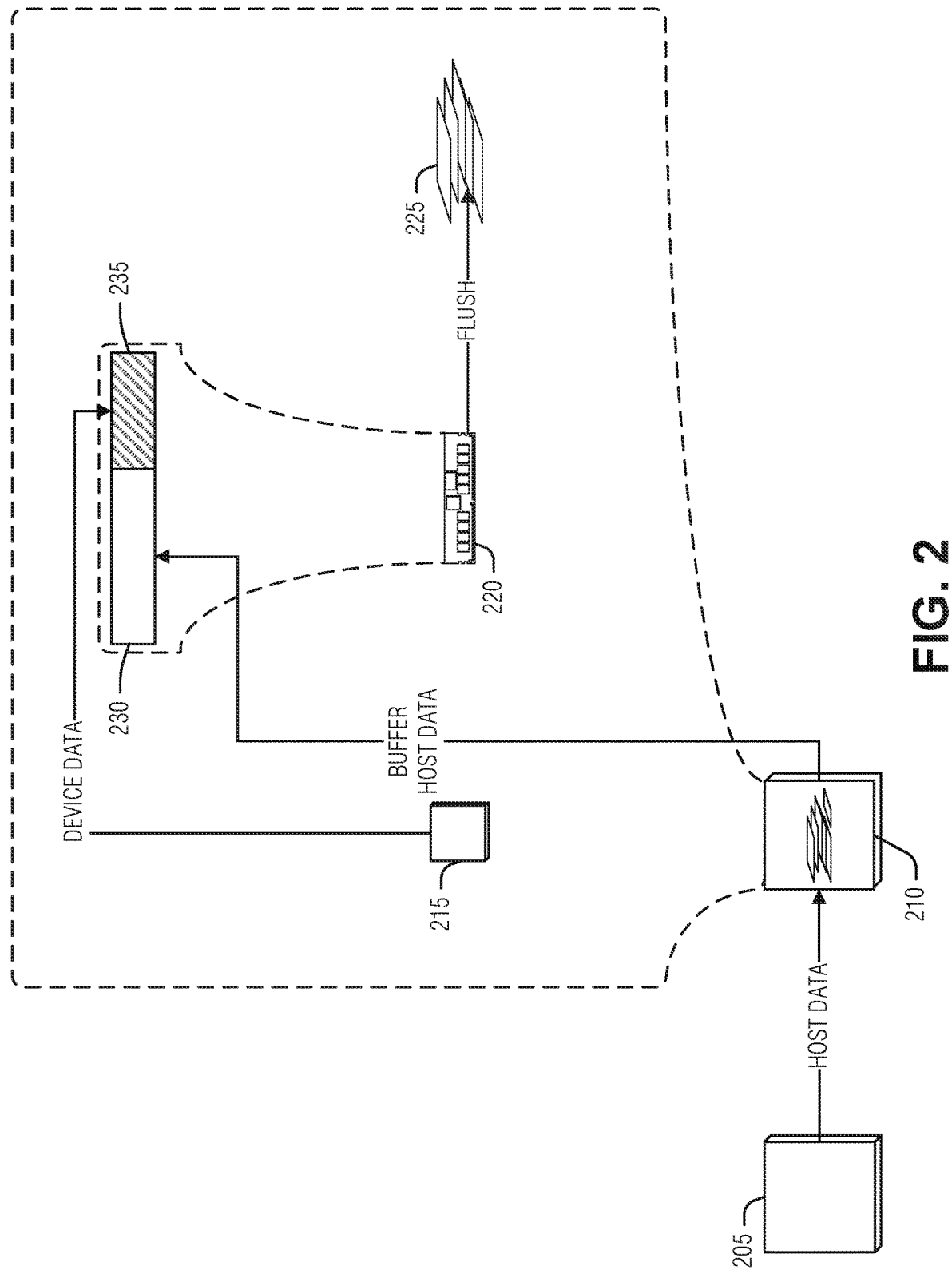
FIG. 2 illustrates an example of a data flow in a system implementing enhanced flush transfer efficiency via flush prediction.

FIG. 2 illustrates an example of a data flow in a system implementing enhanced flush transfer efficiency via flush prediction. Here, the host 205 provides host data 230 to the memory device 210. The memory device 210 buffers the host data 230 in a local cache 220, such as DRAM, SRAM, or a storage class memory.

A component 215 of the memory device 210, such as a memory controller, array controller, etc., continuously or continually evaluates whether a flush trigger will occur before additional user data from the host 205 is received. When the flush trigger prediction is made (e.g., that the flush trigger will be the next event), the component 215 fills the local cache 220 with additional device data 235, such that the local cache 220 is full, or as full as can be achieved given device data size and the size of the free space in the local cache 220 after the host data 230 is accounted for.

If the flush trigger prediction is missed (e.g., incorrect) and the next event is additional data from the host 205, the new user data replaces some or all of the additional data 235 added to the local cache 220. To facilitate this operation, the component 215 can maintain a tag to locate the additional data 235 in the local cache 220. In an example, the tag can be placed at an end (e.g., front or end) of the additional data 235, enabling the component 215 to scan the local cache 220 to find the additional data. In an example, the tag can be a pointer, maintained external to the local cache 220, of an offset into the local cache of an end of the additional data 235. In an example, the tag can also include an extent (e.g., size) of the additional data 235 to facilitate its removal. If there is free space in the local cache 220 following the new user data, additional data 235 is marshaled to fill this space as described above.

Once the device data 235 is marshaled and written to the local cache 220, it remains there until the flush trigger actually occurs. At this point, the local cached is flushed (e.g., written) to the non-volatile storage array 225.

Figure 3:
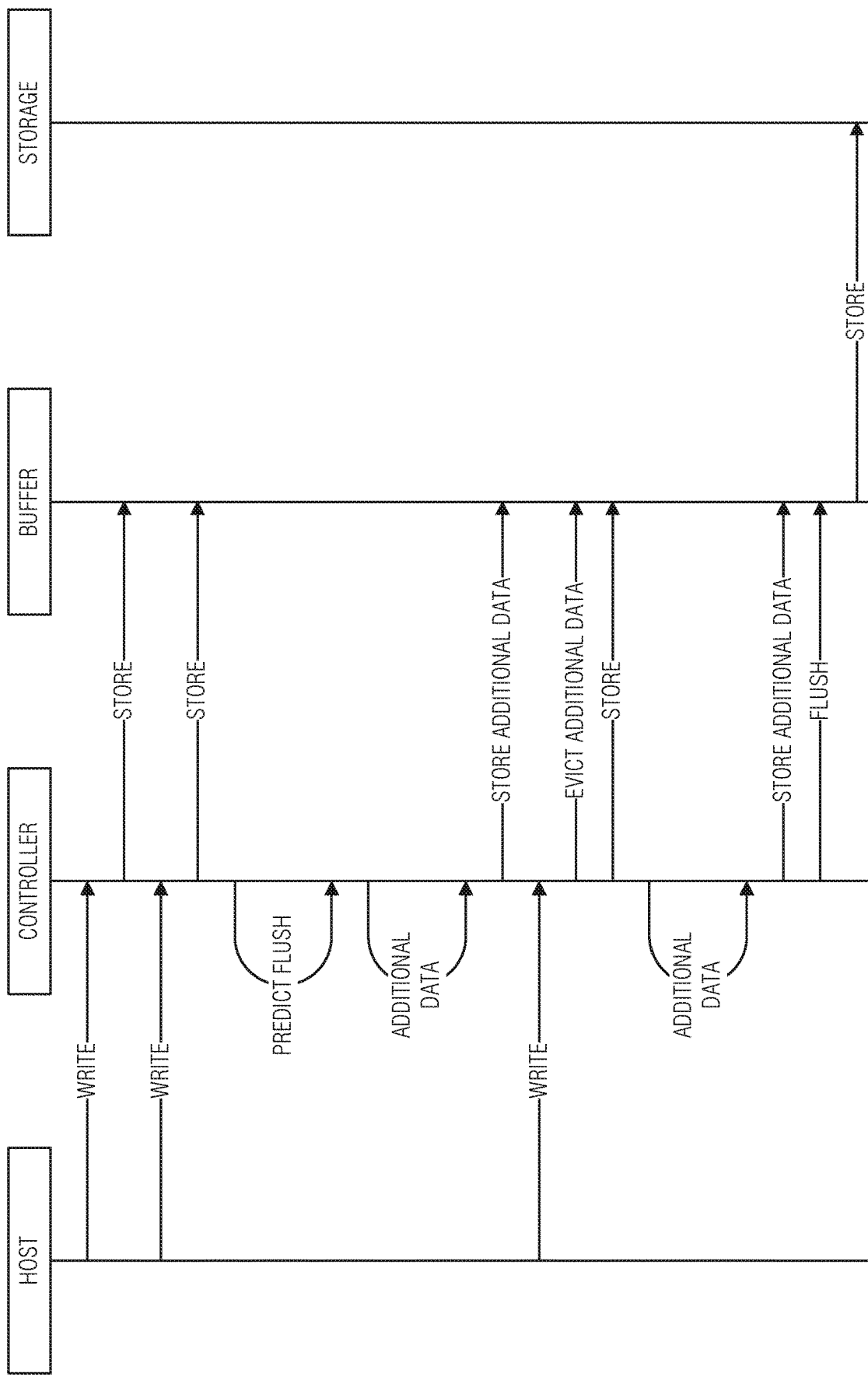
FIG. 3 illustrates an example of an example of a message sequence between components when performing an enhanced flush transfer via flush prediction.

FIG. 3 illustrates an example of an example of a message sequence between components when performing an enhanced flush transfer via flush prediction. When several small pieces of data are written by the host, typically, the controller will append each write to the buffer.

When the controller makes a flush prediction (e.g., predicts that the flush trigger will be the next event), the controller collects additional data and stores it in the buffer to fill-out the buffer (e.g., ensure that the data in the buffer is close to a multiple of the write width).

As illustrated, the flush trigger prediction is incorrect, and the host has an additional write following the storing of the additional data in the write buffer. In response, the controller evicts the additional data from the buffer and stores the new host data in the buffer. In response to this event, the controller marshals new additional data to fill any remaining free space in the buffer. This example relies on the previous flush trigger prediction that it is unlikely additional data will come from the host.

In an example, the controller performs this additional data gathering in response to a new flush trigger prediction. This example enables a recalibration of expectations based on the unexpected write of data from the host.

Upon the arrival of the flush trigger, the controller flushes the buffer to the underlying storage. If the flush trigger prediction was correct, the contents of the buffer will include the user data and the additional data. If the flush trigger prediction was incorrect, then the contents of the buffer will include the user data, the additional user data from the host, and additional data. In any case, there is no additional write latency at the write to the underlying storage because the additional data was added to the buffer prior to the flush trigger.

Figure 4:
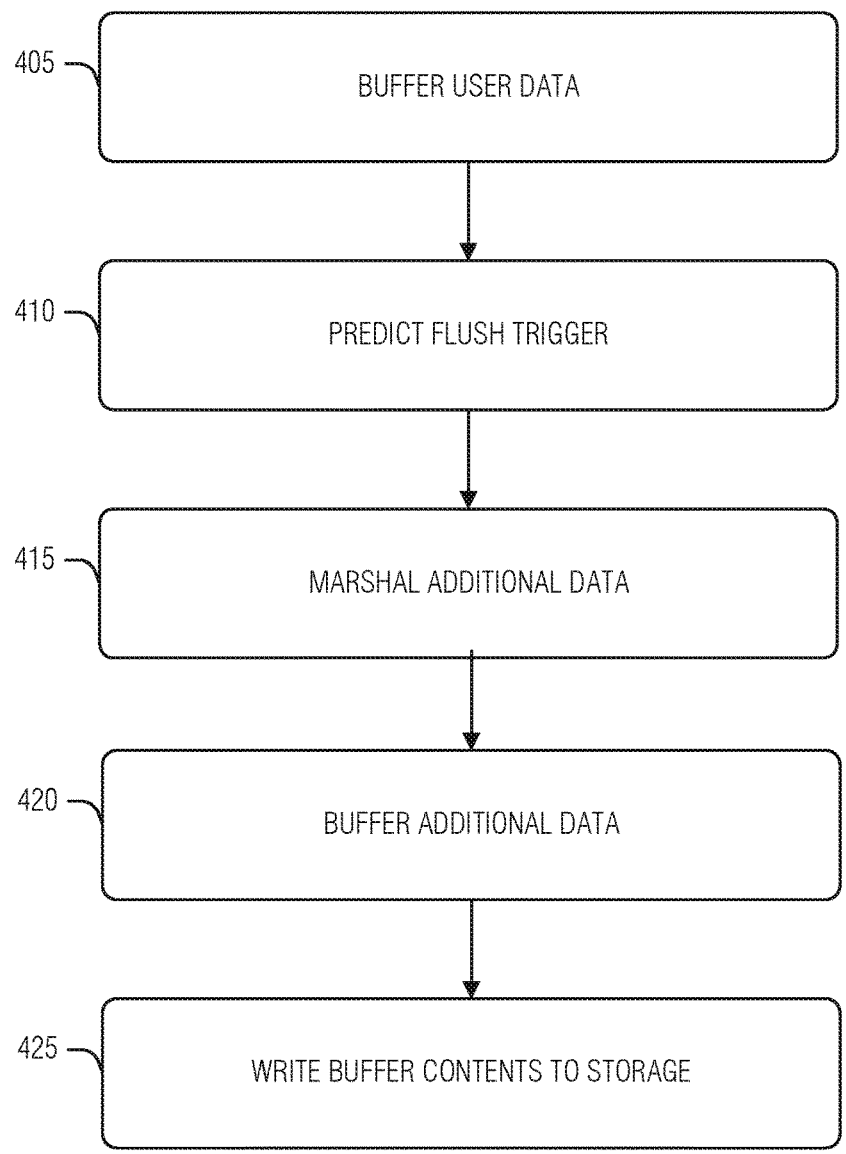
FIG. 4 illustrates a flowchart of a method for enhanced flush transfer efficiency via flush prediction.

FIG. 4 illustrates a flowchart of a method 400 for enhanced flush transfer efficiency. The operations of the method 400 are performed by computer hardware, such as that described above (e.g., a memory controller, array controller, etc.) or below (e.g., processing circuitry).

At operation 405, user data from a user data write is stored in a buffer. Here, the size of the user data put into the buffer is smaller than a write width for a storage device subject to the write. This then results in buffer free space. In an example, the storage device is a NAND flash device. In an example, the write width is a page. In an example, the write width is a block. In an example, the write width is a superblock.

At operation 410, a flush trigger is predicted. In an example, the flush trigger is at least one of receiving a flush command or expiration of a time period. Several techniques can be used to predict the flush trigger. For example, if the host is a device that generally wakes, writes some data, and then sleeps (resulting in either a time-out or explicit flush command), the prediction can be based on recognizing that a wake has occurred (e.g., an interrupt to the storage device to wake) and a calculated average of data written by the host during a wake period (e.g., the first write following the wake). For timeout triggers, the proximity to the timeout can be tracked and a count of host writes approaching the timeout maintained. Thus, if the host is ninety percent likely to not write more data within ten milliseconds of the timeout, then the trigger prediction is made.

At operation 415, additional data is marshaled in response to the prediction of the flush trigger. Here, the additional data has a size that is less than or equal to the buffer free space. In an example, the additional data is maintenance data of the storage device. In an example, the maintenance data is gathered by a controller of the storage device. In an example, the maintenance data includes L2{data mappings. In an example, the maintenance data includes wear leveling data. In an example, the maintenance data includes cross-temperature data. In an example, the maintenance data includes power-down data.

In an example, the additional data is comingled with the user data based on physical addresses. In an example, the additional data includes metadata signifying that it is not user data.

In an example, the additional data is segregated from user data based on physical addresses. In an example, the additional data includes an address identifier upon which the segregation is enforced. In an example, the address identifier is in metadata of the additional data. In an example, the address identifier is one of an absolute address or an address relative to an address of the user data.

At operation 420, the additional data is stored to the buffer free space. Here, the storing including maintaining a tag into the buffer for the additional data. In an example, the tag is a pointer into the buffer.

At operation 425, the contents of the buffer are written to the storage device in response to the flush trigger. Thus, when the flush trigger actually occurs, as opposed to the prediction of the flush trigger, the buffer, including both the user data and the additional data, can be immediately written, reducing write latencies while still efficiently using the underlying storage.

In an example, the method 400 optionally includes the following operations that address a missed flush trigger prediction. The operations include receiving additional user data prior to writing the contents of the buffer to the storage device. Thus, the prediction of operation 410 was incorrect. The additional operation of replacing, in the buffer, a portion of the additional data with the additional user data using the tag accommodates the additional user data from the host. Thus, after this operation, the contents of the buffer include the user data, the additional user data, and a remaining portion of the additional data.

Figure 5:
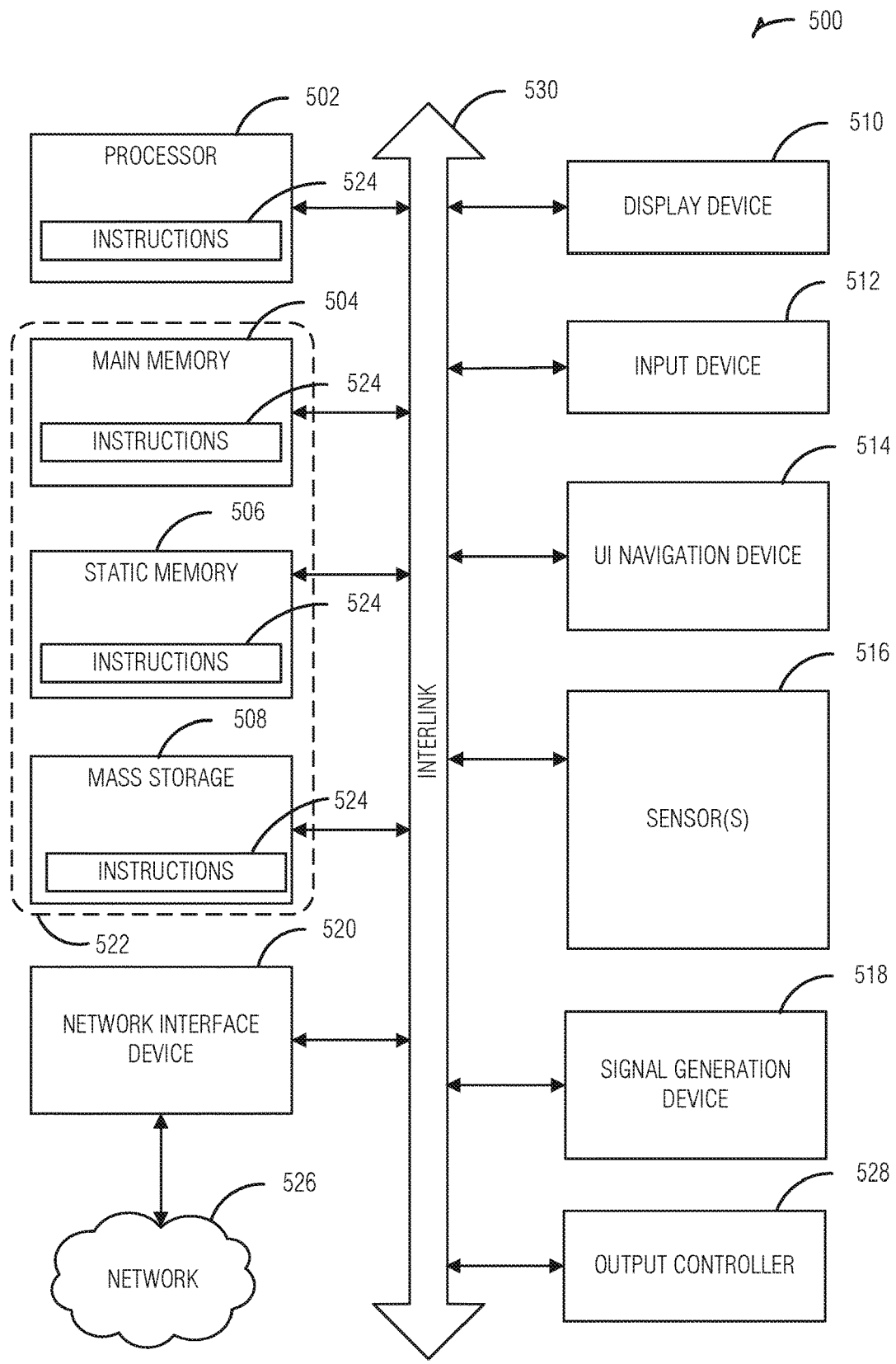
FIG. 5 is a block diagram illustrating an example of a machine upon which one or more embodiments can be implemented.

FIG. 5 illustrates a block diagram of an example machine 500 upon which any one or more of the techniques (e.g., methodologies) discussed herein can perform. In alternative embodiments, the machine 500 can operate as a standalone device or can be connected (e.g., networked) to other machines. In a networked deployment, the machine 500 can operate in the capacity of a server machine, a client machine, or both in server-client network environments. In an example, the machine 500 can act as a peer machine in peer-to-peer (P2P) (or other distributed) network environment. The machine 500 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, movable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system) 500 (e.g., the host device 105, the memory device 110, etc.) can include a hardware processor 502 (e.g., a central processing unit (CPU), a graphics processing unit (GPU), a hardware processor core, or any combination thereof, such as the memory controller 115, etc.), a main memory 504 and a static memory 506, some or all of which can communicate with each other via an interlink (e.g., bus) 508. The machine 500 can further include a display unit 510, an alphanumeric input device 512 (e.g., a keyboard), and a user interface (UI) navigation device 514 (e.g., a mouse). In an example, the display unit 510, input device 512 and UI navigation device 514 can be a touch screen display. The machine 500 can additionally include a storage device (e.g., drive unit) 508, a signal generation device 518 (e.g., a speaker), a network interface device 520, and one or more sensors 516, such as a global positioning system (GPS) sensor, compass, accelerometer, or other sensor. The machine 500 can include an output controller 528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 508 can include a machine readable medium 522 on which is stored one or more sets of data structures or instructions 524 (e.g., software) embodying or utilized by any one or more of the techniques or functions described herein. The instructions 524 can also reside, completely or at least partially, within the main memory 504, within static memory 506, or within the hardware processor 502 during execution thereof by the machine 500. In an example, one or any combination of the hardware processor 502, the main memory 504, the static memory 506, or the storage device 508 can constitute the machine readable medium 522.

While the machine readable medium 522 is illustrated as a single medium, the term "machine readable medium" can include a single medium or multiple media (e.g., a centralized or distributed database, or associated caches and servers) configured to store the one or more instructions 524.

The term "machine readable medium" can include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine readable medium examples can include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 524 (e.g., software, programs, an operating system (OS), etc.) or other data are stored on the storage device 521, can be accessed by the memory 504 for use by the processor 502. The memory 504 (e.g., DRAM) is typically fast, but volatile, and thus a different type of storage than the storage device 521 (e.g., an SSD), which is suitable for long-term storage, including while in an "off" condition. The instructions 524 or data in use by a user or the machine 500 are typically loaded in the memory 504 for use by the processor 502. When the memory 504 is full, virtual space from the storage device 521 can be allocated to supplement the memory 504; however, because the storage 521 device is typically slower than the memory 504, and write speeds are typically at least twice as slow as read speeds, use of virtual memory can greatly reduce user experience due to storage device latency (in contrast to the memory 504, e.g., DRAM). Further, use of the storage device 521 for virtual memory can greatly reduce the usable lifespan of the storage device 521.

In contrast to virtual memory, virtual memory compression (e.g., the Linux® kernel feature "ZRAM") uses part of the memory as compressed block storage to avoid paging to the storage device 521. Paging takes place in the compressed block until it is necessary to write such data to the storage device 521. Virtual memory compression increases the usable size of memory 504, while reducing wear on the storage device 521.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 524 can further be transmitted or received over a communications network 526 using a transmission medium via the network interface device 520 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks) such as those defined by the Third Generation Partnership Project (3GPP) families of standards (e.g., 3G, 4G, 5G, Long Term Evolution (LTE), etc.), Plain Old Telephone (POTS) networks, and wireless data networks (e.g., Institute of Electrical and Electronics Engineers (IEEE) 802.11 family of standards known as Wi-Fi®), IEEE 802.15.4 family of standards, peer-to-peer (P2P) networks, among others. In an example, the network interface device 520 can include one or more physical jacks (e.g., Ethernet, coaxial, or phone jacks) or one or more antennas to connect to the communications network 526. In an example, the network interface device 520 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that can store, encoding or carrying instructions for execution by the machine 500, and includes digital or analog communications signals or other intangible medium to facilitate communication of such software.

ADDITIONAL EXAMPLES

Example 1 is a memory controller for enhanced flush transfer efficiency via flush prediction, the memory controller comprising: an interface to a storage device; a buffer; and processing circuitry to: store user data from a user data write in a buffer, a size of the user data stored in the buffer being smaller than a write width for a storage device subject to the write resulting in buffer free space; predict a flush trigger; marshal additional data in response to the prediction of the flush trigger, the additional data of a size less than or equal to the buffer free space; store the additional data to the buffer free space, the storing including maintaining a tag into the buffer for the additional data; and write, via the interface, contents of the buffer to the storage device in response to the flush trigger.

In Example 2, the subject matter of Example 1, wherein the processing circuitry is arranged to: receive additional user data prior to writing the contents of the buffer to the storage device; and replace, in the buffer, a portion of the additional data with the additional user data using the tag, the contents of the buffer including the user data, the additional user data, and a remaining portion of the additional data.

In Example 3, the subject matter of any of Examples 1-2, wherein the tag is a pointer into the buffer.

In Example 4, the subject matter of any of Examples 1-3, wherein the storage device is a NAND flash device.

In Example 5, the subject matter of Example 4, wherein the write width is a page.

In Example 6, the subject matter of any of Examples 4-5, wherein the write width is a block.

In Example 7, the subject matter of any of Examples 4-6, wherein the write width is a superblock.

In Example 8, the subject matter of any of Examples 1-7, wherein the additional data is maintenance data of the storage device.

In Example 9, the subject matter of Example 8, wherein the maintenance data is gathered by the memory controller.

In Example 10, the subject matter of any of Examples 8-9, wherein the maintenance data includes logical-to-physical data mappings.

In Example 11, the subject matter of any of Examples 8-10, wherein the maintenance data includes wear leveling data.

In Example 12, the subject matter of any of Examples 8-11, wherein the maintenance data includes cross-temperature data.

In Example 13, the subject matter of any of Examples 8-12, wherein the maintenance data includes power-down data.

In Example 14, the subject matter of any of Examples 1-13, wherein the additional data is comingled with the user data based on physical addresses.

In Example 15, the subject matter of Example 14, wherein the additional data includes metadata signifying that it is not user data.

In Example 16, the subject matter of any of Examples 1-15, wherein the additional data is segregated from the user data based on physical addresses.

In Example 17, the subject matter of Example 16, wherein the additional data includes an address identifier upon which the segregation is enforced.

In Example 18, the subject matter of Example 17, wherein the address identifier is in metadata of the additional data.

In Example 19, the subject matter of any of Examples 17-18, wherein the address identifier is one of an absolute address or an address relative to an address of the user data.

In Example 20, the subject matter of any of Examples 1-19, wherein the flush trigger is at least one of receiving a flush command or expiration of a time period.

Example 21 is a method for enhanced flush transfer efficiency via flush prediction, the method comprising: storing user data from a user data write in a buffer, a size of the user data stored in the buffer being smaller than a write width for a storage device subject to the write resulting in buffer free space; predicting a flush trigger; marshaling additional data in response to the prediction of the flush trigger, the additional data of a size less than or equal to the buffer free space; storing the additional data to the buffer free space, the storing including maintaining a tag into the buffer for the additional data; and writing contents of the buffer to the storage device in response to the flush trigger.

In Example 22, the subject matter of Example 21, comprising: receiving additional user data prior to writing the contents of the buffer to the storage device; and replacing, in the buffer, a portion of the additional data with the additional user data using the tag, the contents of the buffer including the user data, the additional user data, and a remaining portion of the additional data.

In Example 23, the subject matter of any of Examples 21-22, wherein the tag is a pointer into the buffer.

In Example 24, the subject matter of any of Examples 21-23, wherein the storage device is a NAND flash device.

In Example 25, the subject matter of Example 24, wherein the write width is a page.

In Example 26, the subject matter of any of Examples 24-25, wherein the write width is a block.

In Example 27, the subject matter of any of Examples 24-26, wherein the write width is a superblock.

In Example 28, the subject matter of any of Examples 21-27, wherein the additional data is maintenance data of the storage device.

In Example 29, the subject matter of Example 28, wherein the maintenance data is gathered by a controller of the storage device.

In Example 30, the subject matter of any of Examples 28-29, wherein the maintenance data includes logical-to-physical data mappings.

In Example 31, the subject matter of any of Examples 28-30, wherein the maintenance data includes wear leveling data.

In Example 32, the subject matter of any of Examples 28-31, wherein the maintenance data includes cross-temperature data.

In Example 33, the subject matter of any of Examples 28-32, wherein the maintenance data includes power-down data.

In Example 34, the subject matter of any of Examples 21-33, wherein the additional data is comingled with the user data based on physical addresses.

In Example 35, the subject matter of Example 34, wherein the additional data includes metadata signifying that it is not user data.

In Example 36, the subject matter of any of Examples 21-35, wherein the additional data is segregated from the user data based on physical addresses.

In Example 37, the subject matter of Example 36, wherein the additional data includes an address identifier upon which the segregation is enforced.

In Example 38, the subject matter of Example 37, wherein the address identifier is in metadata of the additional data.

In Example 39, the subject matter of any of Examples 37-38, wherein the address identifier is one of an absolute address or an address relative to an address of the user data.

In Example 40, the subject matter of any of Examples 21-39, wherein the flush trigger is at least one of receiving a flush command or expiration of a time period.

Example 41 is a machine readable medium including instructions for enhanced flush transfer efficiency via flush prediction, the instructions, when executed by processing circuitry, cause the processing circuitry to perform operations comprising: storing user data from a user data write in a buffer, a size of the user data stored in the buffer being smaller than a write width for a storage device subject to the write resulting in buffer free space; predicting a flush trigger; marshaling additional data in response to the prediction of the flush trigger, the additional data of a size less than or equal to the buffer free space; storing the additional data to the buffer free space, the storing including maintaining a tag into the buffer for the additional data; and writing contents of the buffer to the storage device in response to the flush trigger.

In Example 42, the subject matter of Example 41, wherein the operations comprise: receiving additional user data prior to writing the contents of the buffer to the storage device; and replacing, in the buffer, a portion of the additional data with the additional user data using the tag, the contents of the buffer including the user data, the additional user data, and a remaining portion of the additional data.

In Example 43, the subject matter of any of Examples 41-42, wherein the tag is a pointer into the buffer.

In Example 44, the subject matter of any of Examples 41-43, wherein the storage device is a NAND flash device.

In Example 45, the subject matter of Example 44, wherein the write width is a page.

In Example 46, the subject matter of any of Examples 44-45, wherein the write width is a block.

In Example 47, the subject matter of any of Examples 44-46, wherein the write width is a superblock.

In Example 48, the subject matter of any of Examples 41-47, wherein the additional data is maintenance data of the storage device.

In Example 49, the subject matter of Example 48, wherein the maintenance data is gathered by a controller of the storage device.

In Example 50, the subject matter of any of Examples 48-49, wherein the maintenance data includes logical-to-physical data mappings.

In Example 51, the subject matter of any of Examples 48-50, wherein the maintenance data includes wear leveling data.

In Example 52, the subject matter of any of Examples 48-51, wherein the maintenance data includes cross-temperature data.

In Example 53, the subject matter of any of Examples 48-52, wherein the maintenance data includes power-down data.

In Example 54, the subject matter of any of Examples 41-53, wherein the additional data is comingled with the user data based on physical addresses.

In Example 55, the subject matter of Example 54, wherein the additional data includes metadata signifying that it is not user data.

In Example 56, the subject matter of any of Examples 41-55, wherein the additional data is segregated from the user data based on physical addresses.

In Example 57, the subject matter of Example 56, wherein the additional data includes an address identifier upon which the segregation is enforced.

In Example 58, the subject matter of Example 57, wherein the address identifier is in metadata of the additional data.

In Example 59, the subject matter of any of Examples 57-58, wherein the address identifier is one of an absolute address or an address relative to an address of the user data.

In Example 60, the subject matter of any of Examples 41-59, wherein the flush trigger is at least one of receiving a flush command or expiration of a time period.

Example 61 is a system for enhanced flush transfer efficiency via flush prediction, the system comprising: means for storing user data from a user data write in a buffer, a size of the user data stored in the buffer being smaller than a write width for a storage device subject to the write resulting in buffer free space; means for predicting a flush trigger; means for marshaling additional data in response to the prediction of the flush trigger, the additional data of a size less than or equal to the buffer free space; means for storing the additional data to the buffer free space, the storing including maintaining a tag into the buffer for the additional data; and means for writing contents of the buffer to the storage device in response to the flush trigger.

In Example 62, the subject matter of Example 61, comprising: means for receiving additional user data prior to writing the contents of the buffer to the storage device; and means for replacing, in the buffer, a portion of the additional data with the additional user data using the tag, the contents of the buffer including the user data, the additional user data, and a remaining portion of the additional data.

In Example 63, the subject matter of any of Examples 61-62, wherein the tag is a pointer into the buffer.

In Example 64, the subject matter of any of Examples 61-63, wherein the storage device is a NAND flash device.

In Example 65, the subject matter of Example 64, wherein the write width is a page.

In Example 66, the subject matter of any of Examples 64-65, wherein the write width is a block.

In Example 67, the subject matter of any of Examples 64-66, wherein the write width is a superblock.

In Example 68, the subject matter of any of Examples 61-67, wherein the additional data is maintenance data of the storage device.

In Example 69, the subject matter of Example 68, wherein the maintenance data is gathered by a controller of the storage device.

In Example 70, the subject matter of any of Examples 68-69, wherein the maintenance data includes logical-to-physical data mappings.

In Example 71, the subject matter of any of Examples 68-70, wherein the maintenance data includes wear leveling data.

In Example 72, the subject matter of any of Examples 68-71, wherein the maintenance data includes cross-temperature data.

In Example 73, the subject matter of any of Examples 68-72, wherein the maintenance data includes power-down data.

In Example 74, the subject matter of any of Examples 61-73, wherein the additional data is comingled with the user data based on physical addresses.

In Example 75, the subject matter of Example 74, wherein the additional data includes metadata signifying that it is not user data.

In Example 76, the subject matter of any of Examples 61-75, wherein the additional data is segregated from the user data based on physical addresses.

In Example 77, the subject matter of Example 76, wherein the additional data includes an address identifier upon which the segregation is enforced.

In Example 78, the subject matter of Example 77, wherein the address identifier is in metadata of the additional data.

In Example 79, the subject matter of any of Examples 77-78, wherein the address identifier is one of an absolute address or an address relative to an address of the user data.

In Example 80, the subject matter of any of Examples 61-79, wherein the flush trigger is at least one of receiving a flush command or expiration of a time period.

Example 81 is at least one machine-readable medium including instructions that, when executed by processing circuitry, cause the processing circuitry to perform operations to implement of any of Examples 1-80.

Example 82 is an apparatus comprising means to implement of any of Examples 1-80.

Example 83 is a system to implement of any of Examples 1-80.

Example 84 is a method to implement of any of Examples 1-80.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell can be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device can be configured to provide wear cycle information to the memory device with each memory operation. The memory device control circuitry (e.g., control logic) can be programmed to compensate for memory device performance changes corresponding to the wear cycle information. The memory device can receive the wear cycle information and determine one or more operating parameters (e.g., a value, characteristic) in response to the wear cycle information.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A memory device comprising:
a storage array; and
at least one processor that, when in operation, is configured to perform operations comprising:
predicting when a write buffer for the storage array will be flushed;
obtaining data generated by the memory device; and
writing, in response to predicting when the write buffer will flush, the data generated by the memory device to the write buffer until the write buffer is full.

2. The memory device of claim 1, wherein writing the data generated by the memory device to the write buffer includes creating a tag to identify the data generated by the memory device in the write buffer.

3. The memory device of claim 2, wherein the operations comprise:
receiving additional user data prior to flushing the write buffer to the storage array; and
replacing the data obtained from the memory device in the buffer with the additional user data, wherein the tag is used to identify the data generated by the memory device.

4. The memory device of claim 1, wherein the storage array includes a NAND flash device, and wherein the write buffer has size determined by a write width for the NAND flash device, wherein the size is one of a page, a block, or a superblock of the NAND flash device.

5. The memory device of claim 1, wherein the data generated by the memory device is at least one of logical-to-physical data mappings, wear leveling data, cross-temperature data, or power-down data.

6. The memory device of claim 1, wherein the data generated by the memory device is stored in the storage array prior to being written in the write buffer, and wherein the data generated by the memory device is segregated from user data in the storage array based on physical addresses.

7. The memory device of claim 6, wherein the data generated by the memory device includes an address identifier upon which the segregation is enforced, wherein the address identifier is stored in metadata of the data generated by the memory device, and wherein the address identifier is one of an absolute address or an address relative to an address of the user data.

8. A method comprising:
predicting, by processing circuitry of a memory device, when a write buffer for a storage array of the memory device will be flushed;
obtaining data generated by the memory device; and
writing, in response to predicting when the write buffer will flush, the data generated by the memory device to the write buffer until the write buffer is full.

9. The method of claim 8, wherein writing the data generated by the memory device to the write buffer includes creating a tag to identify the data generated by the memory device in the write buffer.

10. The method of claim 9, wherein the operations comprise:
receiving additional user data prior to flushing the write buffer to the storage array; and
replacing the data obtained from the memory device in the buffer with the additional user data, wherein the tag is used to identify the data generated by the memory device.

11. The method of claim 8, wherein the storage array includes a NAND flash device, and wherein the write buffer has size determined by a write width for the NAND flash device, wherein the size is one of a page, a block, or a superblock of the NAND flash device.

12. The method of claim 8, wherein the data generated by the memory device is at least one of logical-to-physical data mappings, wear leveling data, cross-temperature data, or power-down data.

13. The method of claim 8, comprising storing the data generated by the memory device in the storage array prior to being written in the write buffer, wherein the data generated by the memory device is segregated from user data in the storage array based on physical addresses.

14. The method of claim 13, wherein the data generated by the memory controller includes an address identifier upon which the segregation is enforced, wherein the address identifier is stored in metadata of the data generated by the memory device, and wherein the address identifier is one of an absolute address or an address relative to an address of the user data.

15. A non-transitory machine-readable medium including instructions that, when executed by processing circuitry on a memory device, cause the processing circuitry to perform operations comprising:
   predicting when a write buffer for a storage array of the memory device will be flushed;
   obtaining data generated by the memory device; and
   writing, in response to predicting when the write buffer will flush, the data generated by the memory device to the write buffer until the write buffer is full.

16. The non-transitory machine-readable medium of claim 15, wherein writing the data generated by the memory device to the write buffer includes creating a tag to identify the data generated by the memory device in the write buffer.

17. The non-transitory machine-readable medium of claim 16, wherein the operations comprise:
   receiving additional user data prior to flushing the write buffer to the storage array; and
   replacing the data obtained from the memory device in the buffer with the additional user data, wherein the tag is used to identify the data generated by the memory device.

18. The non-transitory machine-readable medium of claim 15, wherein the storage array includes a NAND flash device, and wherein the write buffer has size determined by a write width for the NAND flash device, wherein the size is one of a page, a block, or a superblock of the NAND flash device.

19. The non-transitory machine-readable medium of claim 15, wherein the data generated by the memory device is at least one of logical-to-physical data mappings, wear leveling data, cross-temperature data, or power-down data.

20. The non-transitory machine-readable medium of claim 15, wherein the operations comprise storing the data generated by the memory device in the storage array prior to being written in the write buffer, and wherein the data generated by the memory device is segregated from user data in the storage array based on physical addresses.

21. The non-transitory machine-readable medium of claim 20, wherein the data generated by the memory controller includes an address identifier upon which the segregation is enforced, wherein the address identifier is stored in metadata of the data generated by the memory device, and wherein the address identifier is one of an absolute address or an address relative to an address of the user data.

* * * * *